(12) United States Patent
Maynard et al.

(10) Patent No.: US 7,898,326 B2
(45) Date of Patent: Mar. 1, 2011

(54) DEVICE AND METHOD FOR AMPLIFYING RADIOCOMMUNICATION SIGNALS

(75) Inventors: Jean Maynard, Ramonville (FR);
Philippe Chabbert, Saubens (FR);
Raoul Rodriguez, Bruguieres (FR);
Patrick Ayouaz, Saint Lys (FR);
Thierry Peyretaillade, Toulouse (FR)

(73) Assignee: Thales (FR)

( * ) Notice: Subject to any disclaimer, the term of this patent is extended or adjusted under 35 U.S.C. 154(b) by 74 days.

(21) Appl. No.: 12/298,088

(22) PCT Filed: Mar. 28, 2007

(86) PCT No.: PCT/EP2007/052950
§ 371 (c)(1),
(2), (4) Date: Mar. 24, 2009

(87) PCT Pub. No.: WO2007/122059
PCT Pub. Date: Nov. 1, 2007

(65) Prior Publication Data
US 2009/0219097 A1 Sep. 3, 2009

(30) Foreign Application Priority Data
Apr. 21, 2006 (FR) ...................................... 06 51405

(51) Int. Cl.
*H03G 3/20* (2006.01)

(52) U.S. Cl. ........................................................ 330/140
(58) Field of Classification Search .................. 330/140, 330/144, 284
See application file for complete search history.

(56) References Cited

U.S. PATENT DOCUMENTS

| 2003/0055590 A1 | 3/2003 | Park et al. |
| 2006/0006940 A1 | 1/2006 | Hu et al. |
| 2006/0293009 A1* | 12/2006 | Kobayashi ................. 455/232.1 |

FOREIGN PATENT DOCUMENTS

| DE | 19623930 | 12/1997 |
| JP | 57030429 | 2/1982 |

* cited by examiner

*Primary Examiner* — Steven J Mottola
(74) *Attorney, Agent, or Firm* — Lowe Hauptman Ham & Berner, LLP

(57) ABSTRACT

A method for amplifying radiocommunication signals via a string of amplifiers associated with a gain controller receiving an amplification setpoint of constant value, in order to produce an amplification of constant gain or of variable value, in order to produce an amplification with constant amplified power with the aid of a first regulator that is able to deliver this variable value setpoint based on a measurement of the amplified power. So that, in constant gain amplification mode, a setpoint transmitted by the first regulator is held at a value close to the setpoint of constant value.

13 Claims, 6 Drawing Sheets

US 7,898,326 B2

DEVICE AND METHOD FOR AMPLIFYING RADIOCOMMUNICATION SIGNALS

CROSS-REFERENCE TO RELATED APPLICATIONS

The present Application is based on International Application No. PCT/EP2007/052950, filed on Mar. 28, 2007, which in turn corresponds to French Application No. 06 51405 filed on Apr. 21, 2006, and priority is hereby claimed under 35 USC § based on these applications. Each of these applications are hereby incorporated by reference in their entirety into the present application.

FIELD OF THE INVENTION

The present invention relates to a device and a method for amplifying radiocommunication signals.

BACKGROUND OF THE INVENTION

It is known practice to process radiocommunication signals according to a first mode amplifying these signals with a constant gain or according to a second mode amplifying these signals up to a constant output power of the amplifier irrespective of the input power of these signals.

Certain items of telecommunication equipment, such as satellites, alternate these two amplification modes. Therefore, radiocommunication signals received by certain satellites may be amplified according to the first constant gain mode, this method being called hereinafter FGM for Fixed Gain Mode, or according to the second constant output power mode, this method being called hereinafter ALC for Automatic Level Control.

US 2006/0006940 relates to an amplification device having a plurality of operating modes. DE 196 23 930 describes a system of amplifiers, each amplifier having an adjustable attenuator receiving control signals. JP 57030429 relates to an automatic restoration system for an automatic level regulator. US 2003/055590 describes an amplifier operating in an ALC mode or in an FGM.

FIG. 1a represents schematically an amplification device 100 making it possible to alternate the two modes, FGM or ALC, in order to amplify an input power $P_{in}$ of a radiocommunication signal up to an output power $P_{out}$.

For this purpose, this device 100 comprises a string 101 of amplifiers 112 whose gain is partially controlled by a gain controller 113, the operation of this controller 113 being determined by a setpoint which varies according to the amplification mode of the device 100. In this example, this setpoint is a voltage $V_{att}$.

A control circuit 104 delivers such a setpoint, or voltage, $V_{att}$ of fixed value $V_{fgm}$ transmitted by a source REF FGM, in order to obtain a constant gain in the string 101 of amplifiers 102, or of variable value $V_{alc}$, in order to obtain a constant power $P_{out}$ at the output of the device 100.

In this latter case, the variable setpoint $V_{alc}$ is obtained at the output of a regulator 106 forming a control loop in order to regulate this voltage as a function of the difference between the desired output power $P_{out}$ and a setpoint REF ALC of the regulator 106 transmitted by a device not shown. To do this, this regulator 106 may comprise an operational amplifier 141—and other electronic components not shown—while the measurement of the output power $P_{out}$ is taken through a detector 108 correcting the effects of temperature on the measurement.

Such a device 100 has considerable variations in the gain of amplification and output power $P_{out}$ during the transition from an FGM mode to an ALC mode as illustrated in FIG. 1b which represents the variation (ordinate axis 120, in dBm) in the output power $P_{out}$ of a device 100 as a function of the time (abscissa axis 122, in ms) wherein there is a change 124 in the amplification mode for the device 100.

Actually, when the device 100 is in FGM mode, the regulator 106 supplies a maximum voltage $V_{alcmax}$ in order to bring the output power $P_{out}$ to a constant power such that, during the switchover to ALC mode via a switchover of a switch 105, the control voltage $V_{att}$ reaches this maximum voltage $V_{alcmax}$ before tending toward a value specific to an operating point of the circuit.

Such a power variation is problematical because it risks causing signal losses, notably between a satellite and a ground station. As a result, a circuit 204 (FIG. 2a) controlling a string 201 of amplifiers 212 may comprise means so that the voltage $V_{alc}$ at the output of a regulator 206 is fixed at a value that is fixed and close to a predetermined setpoint value $V_{fgm}$ and suitable for an FGM mode.

Considering a regulator 206 comprising an operational amplifier 241, this result is achieved by incorporating a set of resistors 244 and 246 fixing the output voltage of the regulator 206 at a precise value when the device 200 is operating in FGM mode, a capacitor 240 and a resistor 242 forming an integrator element with the amplifier 241 in order to supply a variable setpoint based on the setpoint REF ALC in ALC mode.

Such a configuration makes it possible to obtain, as shown in FIG. 2b, a variation of amplified power $P_{out}$ that is relatively limited during a change 224 from an FGM mode to an ALC mode (axis of the ordinates 220, in dBm) as a function of the time (axis of the abscissae 222, in ms).

SUMMARY OF THE INVENTION

The present invention is the result of a finding specific to the invention according to which the continuity of these switchovers is obtained only for given conditions, notably in terms of temperature, power and/or operating frequency of the string 201 of amplifiers 212, as shown in FIGS. 3a and 3b which represent output powers (axis of the ordinates 320, in dBm) measured for the circuit 200 as a function of the time (axis of the abscissae 322, in ms) with respective temperature variations of +41° C. and of −36° C., that is to say variations of the order of +/−40° C. relative to the measurements represented in FIG. 2b.

This is why the present invention relates to a method for amplifying radiocommunication signals by a string of amplifiers associated with a gain controller receiving an amplification setpoint of constant value, in order to produce an amplification of constant gain or of variable value, in order to produce an amplification with constant amplified power with the aid of a first regulator that is able to deliver this variable value setpoint based on a measurement of the amplified power, characterized in that, in constant gain amplification mode, a setpoint transmitted by the first regulator is held close to the setpoint of constant value.

By holding the setpoint supplied by the first regulator close to the constant value setpoint, the method has the advantage of making transitions from an FGM mode to an ALC mode having very limited, or even nonexistent, output power variations, irrespective of the variations in the conditions of temperature, power and/or frequency of the amplifier concerned.

Actually, the invention ensures that the setpoint transmitted by the regulator, in ALC mode, is close to the setpoint in FGM mode irrespective of the variations due to the operating conditions of the amplifier. Consequently, the transition from the FGM setpoint to the ALC setpoint take place with continuity and in a corollary manner, with limited gain variations.

In one embodiment, the method comprises the additional step of transmitting to the first regulator a signal originating from the second regulator or a measurement of the output power as a function of the amplification produced. Therefore, a simple switching of the signal transmitted to the first regulator makes it possible to switchover the operation of the latter from a feedback loop with the second regulator—in order to form a setpoint close to the setpoint of constant value—to a feedback loop with the string of amplifiers—in order to supply a constant amplified power.

According to one embodiment, the method comprises the additional step of transmitting to the controller a setpoint originating from a source of constant setpoint or from the first regulator that is able to deliver the variable setpoint by a switching made as a function of the amplification produced. Therefore, the transmission of a setpoint to the controller is simple to implement.

In one embodiment, the method comprises the additional step of increasing the response time of the first regulator in order to filter certain spurious signals.

The present invention also relates to a device for amplifying radiocommunication signals transmitted in a string of amplifiers furnished with a gain controller receiving a setpoint from a circuit comprising a first regulator forming, in a first amplification position at a constant amplified power, a feedback loop on the string based on a detector of the amplified power, characterized in that it comprises a second regulator forming with the first regulator, in a second amplification position of the constant gain circuit, a feedback loop holding a setpoint transmitted by the first regulator at a value close to the setpoint of constant value.

In a manner similar to the method described above, the device holds the setpoint supplied by the first regulator close to the setpoint of constant value which makes it possible to make transitions from an FGM mode to an ALC mode having very limited, or even nonexistent, output power variations, irrespective of the variations of the conditions of temperature, power and/or frequency of the amplifier concerned.

In one embodiment, the device comprises a switch which connects the first regulator to the second regulator or to the detector of amplified power as a function of the amplification produced. Therefore a simple switch of the signal transmitted to the first regulator makes it possible to switch the operation of the latter from a feedback loop with the second regulator—in order to supply a setpoint close to the setpoint of constant value—to a feedback loop with the string of amplifiers, in order to supply a constant amplified power.

According to one embodiment, the device comprises a second switch which connects the controller to the first regulator or to the source of constant setpoint as a function of the amplification produced.

In one embodiment, at least one regulator comprises an operational amplifier, which makes it possible to obtain reliable, low-cost regulators.

According to one embodiment, the first and the second regulator comprising an operational amplifier, each operational amplifier is associated with at least one resistor and with one capacitor such that the response time of the first regulator is greater than the response time of the second regulator.

In one embodiment, the first regulator is associated with means making it possible to increase its response time, which makes it possible to filter any spurious signals.

The invention also relates to a method and a circuit applying a control of the setpoint of a gain produced by an automatic device. More precisely:

A method of controlling an automatic device applying a function with a given gain, this automatic device receiving a setpoint of constant value, in order to obtain a constant gain, or of variable value, in order to deliver a constant output application with the aid of a first regulator delivering the setpoint of variable value based on a measurement of the delivered function, characterized in that, in constant gain mode, the setpoint of variable value transmitted by the first regulator is held at a value close to the setpoint of constant value.

A control circuit of an automatic device applying a function with a given gain, this automatic device receiving a setpoint of constant value, in order to obtain a constant gain, or of variable value, in order to deliver a constant output application with the aid of a first regulator delivering the setpoint of variable value based on a measurement of the delivered function, characterized in that it comprises a second regulator forming, in constant gain amplification mode, a feedback loop with the first regulator in order to hold a setpoint transmitted by this first regulator at a value close to the setpoint of constant value.

Finally, the invention relates to a satellite comprising a device for amplifying radiocommunication signals transmitted by a string of amplifiers furnished with a gain controller receiving a setpoint from a circuit comprising a first regulator forming, in a first amplification position of the circuit, a feedback loop on the string based on a detector of the amplified power in order to supply a variable setpoint to the controller, characterized in that it comprises a second regulator forming, in constant gain amplification mode, a feedback loop with the first regulator in order to hold a setpoint transmitted by this first regulator at a value close to the setpoint of constant value.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

DETAILED DESCRIPTION OF THE INVENTION

Figure 1A:
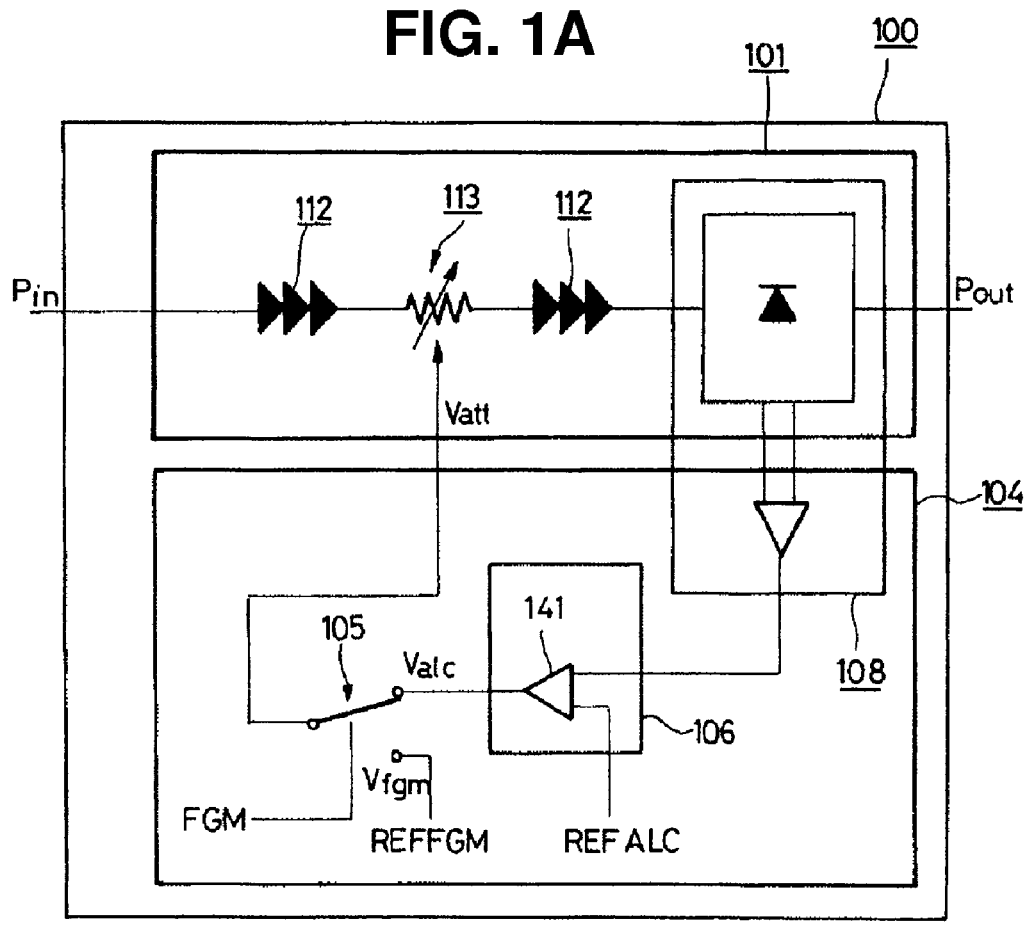
FIGS. 1a and 1b, already described, represent respectively a first amplification device and its gain for various amplification modes, FIGS. 2a and 2b, already described, represent respectively a second amplification device and its gain for various amplification modes.
Figure 1B:
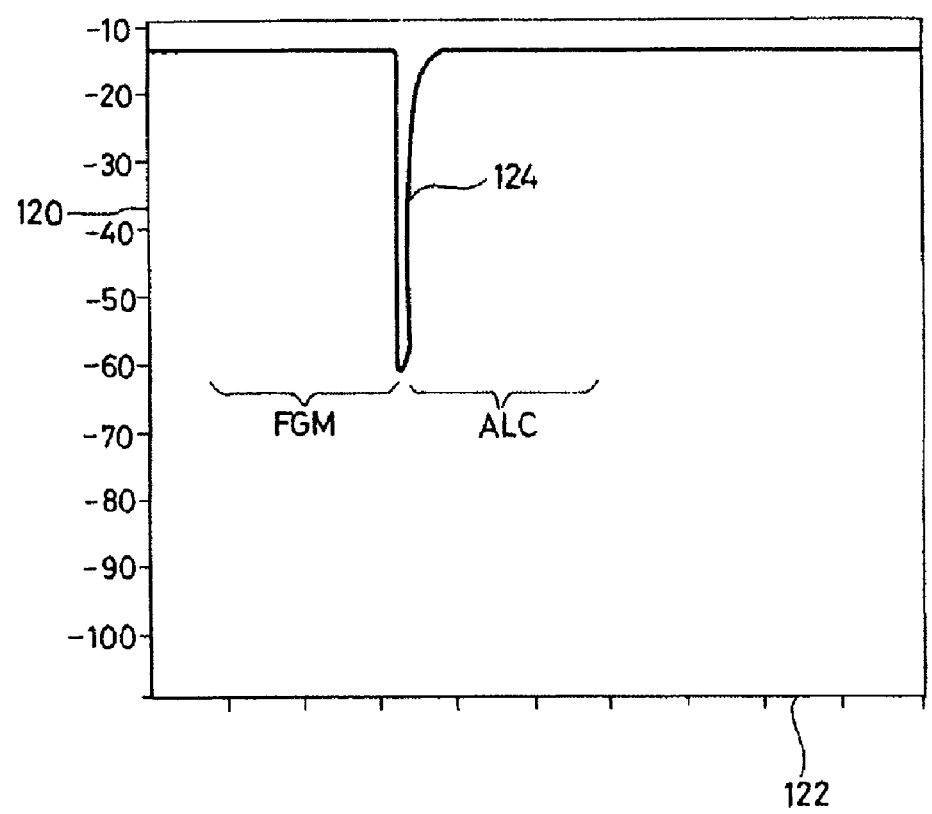
Figure 2A:
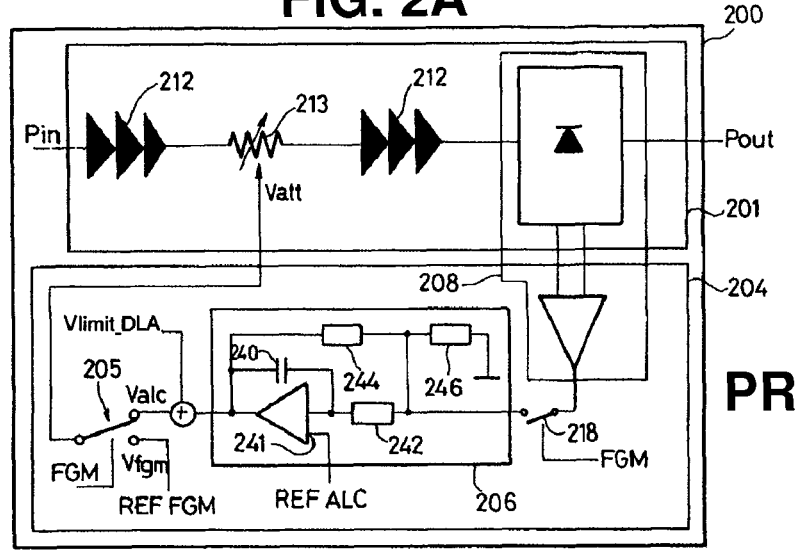
Figure 2B:
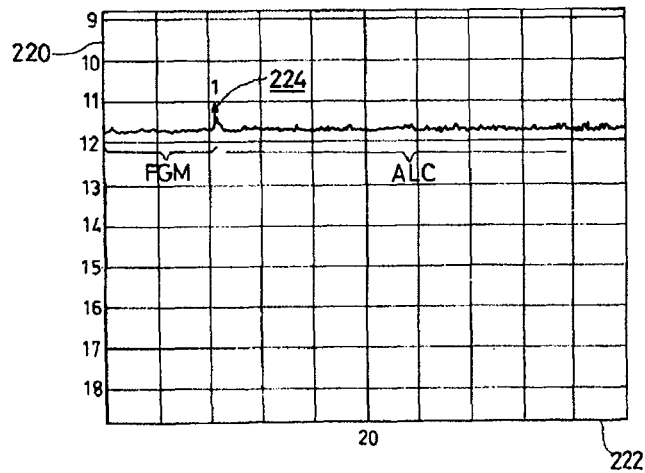
Figure 3A:
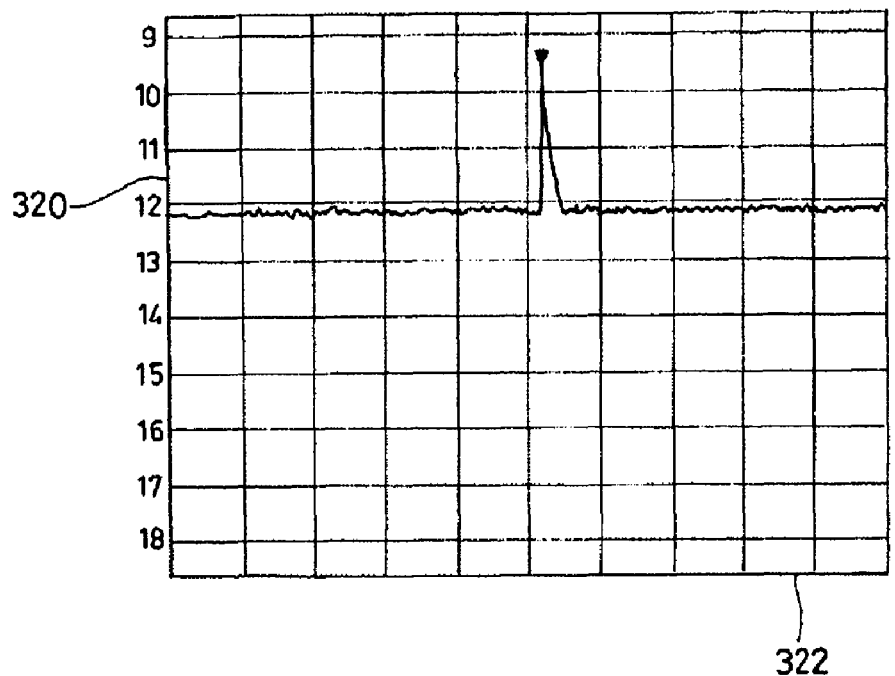
FIGS. 3a and 3b represent the gain of the amplification device described in FIG. 2a when its temperature varies.
Figure 3B:
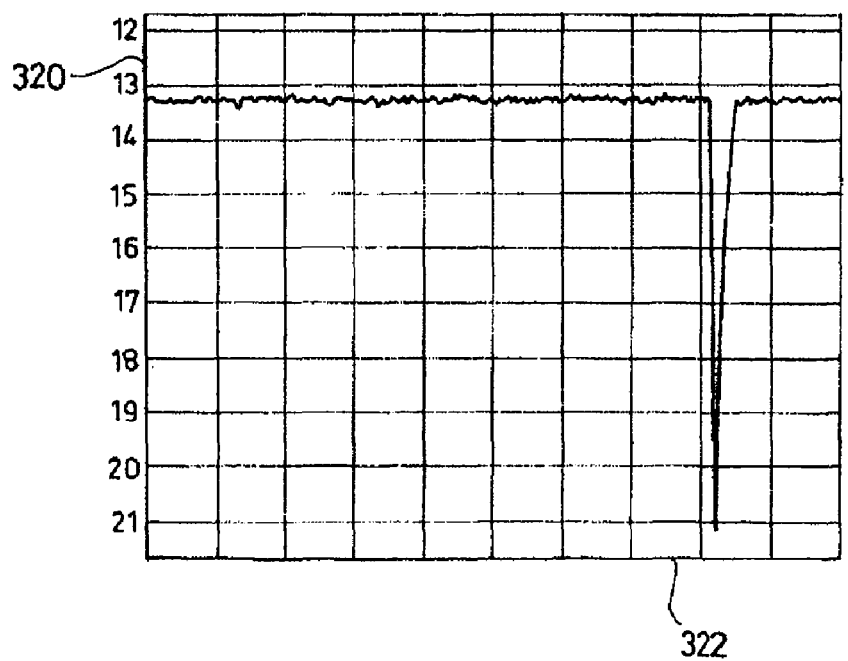
Figure 4A:
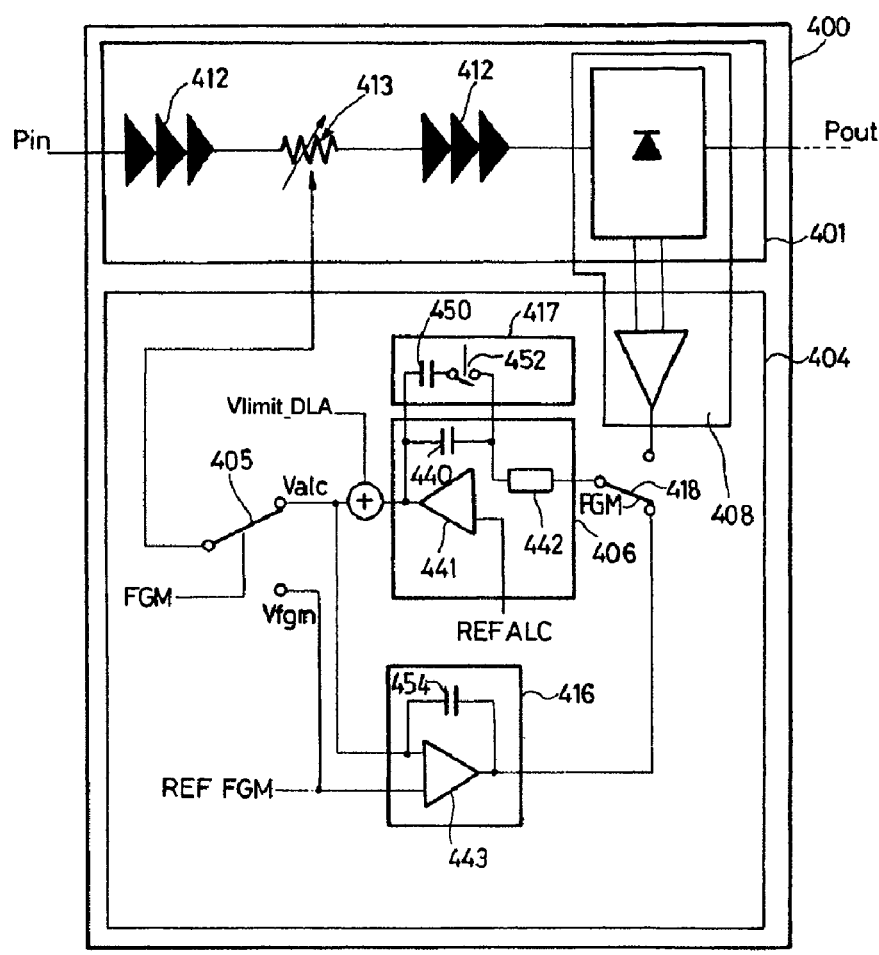
FIGS. 4a and 4b represent respectively an amplification device according to the invention and its gain for various amplification modes.
Figure 4B:
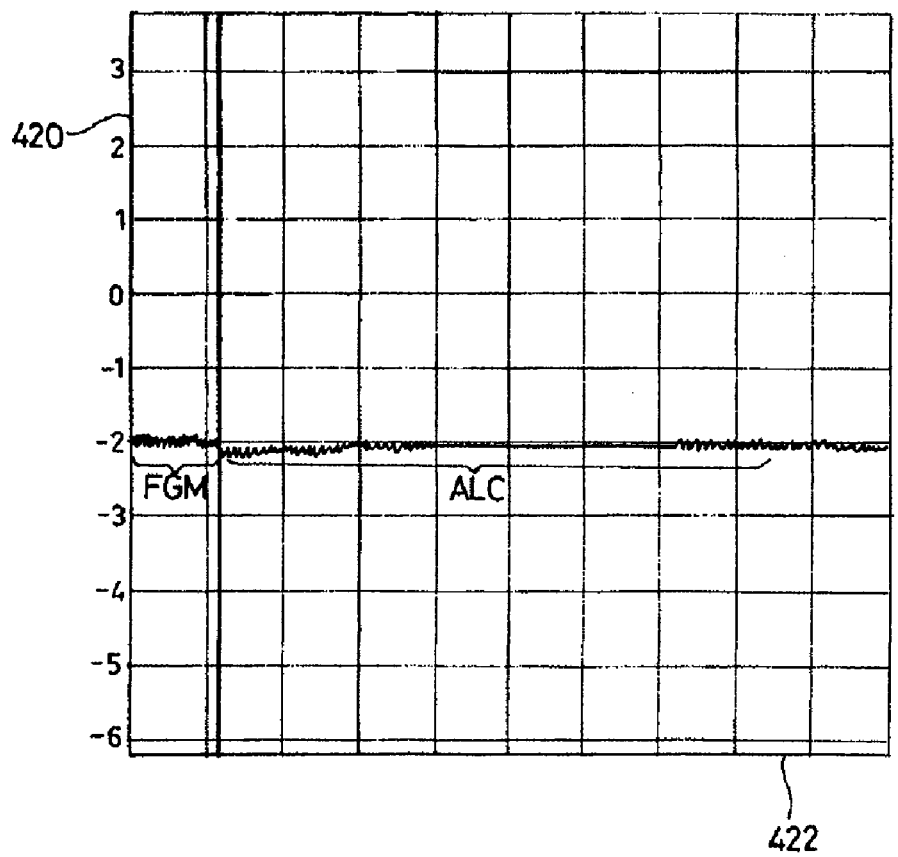

As shown in FIG. 4a, a device 400 for amplifying radiocommunication signals implementing the invention comprises a string 401 of amplifiers 412 whose gain is controlled partly by an amplification setpoint $V_{att}$, transmitted by a control circuit 404 to a gain controller 413. This setpoint $V_{att}$ may alternate between two values:
- either a constant value $V_{fgm}$, in which case the string 401 of amplifiers 412 produces an amplification with constant gain of the FGM type,
- or a variable value $V_{alc}$, in which case the string 401 of amplifiers 412 produces an amplification of the ALC type at a constant output power.

In order to apply this second amplification mode, the circuit 400 comprises a first regulator 406 delivering a setpoint of variable value $V_{alc}$ based on a closed-loop control using the measurement of the output power $P_{out}$ of the amplifier with the aid of a temperature-compensated detector 408.

According to the invention, a second regulator 416 regulates the first regulator 406 when the device 400 operates in constant gain amplification mode FGM so that the latter automatically and dynamically supplies a setpoint close to or equal to the setpoint $V_{fgm}$ while following any changes to this constant setpoint $V_{fgm}$ due to the variations of one or more operating parameters of the device such as its frequency or its temperature.

For this, this second regulator 416 produces a closed-loop control of the setpoint of variable value $V_{alc}$ transmitted by the first regulator based on the setpoint of constant value $V_{fgm}$ applied by the circuit 400.

Such a closed-loop control may be produced by connecting, in FGM mode, the second regulator 416 to the first regulator 406 so that these regulators 406 and 416 form a loop whose balance imposes a setpoint $V_{alc}$ at the output of the regulator 406 corresponding to the value of the constant setpoint $V_{fgm}$.

In ALC mode, such a feedback loop must not be applied so that the first regulator can modify its output signal from the regulator 406 to a setpoint value $V_{alc}$ making it possible to obtain a constant output power $P_{out}$.

These results are achieved thanks to a switch 418 which connects an input of the first regulator 406, in one position, to the output of the second regulator 416 or, in another position, to the output of the detector 408.

Considering that the first regulator 406 and the second regulator 416 comprise respectively an operational amplifier 441 or 443, it appears that the use of simple electronic components such as a capacitor 440 or 454 and a resistor 442 make it possible to form the regulator 406 or the regulator 416.

For the purposes of clarity, only a few components have been shown because the choice of their values makes it possible to determine the response time of each regulator. Therefore, the first regulator 406 is associated with a capacitor 440 of 100 nF and with a resistor 442 whose value varies between 10 kOhm and 1 MOhm according to the desired bandwidth, for example 250 kOhm.

For the response time of the regulator 416 to be less than the response time of the second regulator 406, it is possible to associate with this second regulator 416 a capacitor 454 of 1 microF and a resistor—not shown—of 3.16 kOhm. Furthermore, the time constant of the regulator 406 may be modified with the aid of a second capacitor 450 of 1 microF that is able to be placed in parallel with the first capacitor 440 thanks to a switch 452 with the aid of a device 417.

Such an increase in the response time makes it possible to filter, for example at the time of the change from FGM to ALC mode, shifts of the control circuit 404 or of the amplification device 400 due to the operating parameters of the device such as its frequency or its temperature, and its end-of-life environment such as the loads accumulated by irradiation or its aging.

Figure 5:
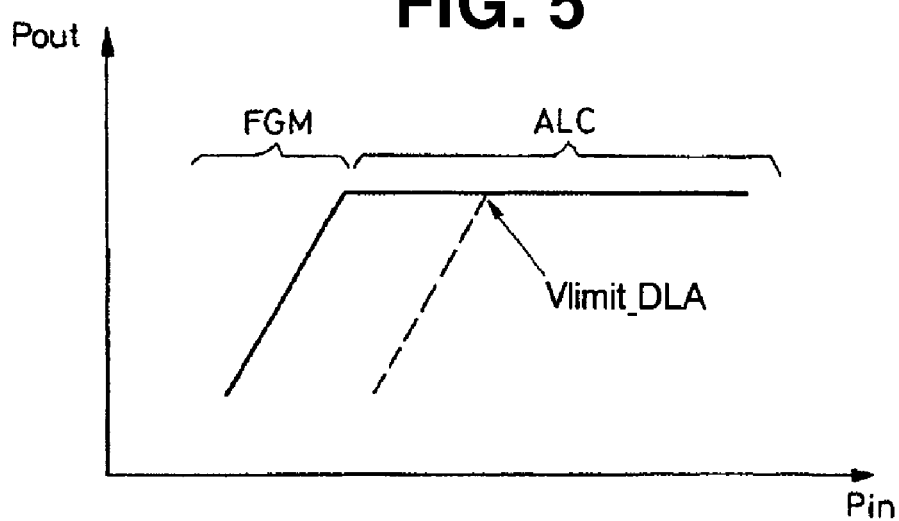
FIG. 5 represents the gain of a device according to the invention.

A device 400 according to the invention may be used as a DLA (Driver Limiter Amplifier), that is to say to produce the amplification of signals received by a space relay such as a satellite which may therefore modify its amplification mode as shown in FIG. 5 which represents the output power $P_{out}$ (axis of the ordinates) as a function of the input power $P_{in}$ (axis of the abscissae) depending on the FGM or ALC mode used.

As an example, these power values typically vary in a satellite between −20 and −60 dBm for $P_{in}$ and −20 dBm to +10 dBm for $P_{out}$, the amplified signals having a frequency of between 100 MHz and 100 GHz.

FIG. 5 shows the possible variation of the point 504 of loss of synchronism of the loop ALC as a function of the input power $P_{in}$. This loss of synchronism of the loop may be controlled in ALC mode by a voltage Vlimit_DLA, whose source is represented in FIG. 4a, in order to obtain in ALC mode a control of the string 401 similar to an FGM mode without having switched to FGM mode.

The present invention is capable of many variants. Notably, the regulators 406 and 416 may be obtained by programmable microcomponents whose transfer function allows an operation equivalent to the operation described above of the regulators 406 and 416.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. A method for amplifying radiocommunication signals by a string of amplifiers associated with a gain controller receiving an amplification setpoint ($V_{att}$) of constant value ($V_{fgm}$), in order to produce an amplification with constant gain (FGM) or with variable value ($V_{alc}$), in order to produce an amplification (ALC) with constant amplified power ($P_{out}$) with the aid of a first regulator that is able to deliver this variable value setpoint ($V_{alc}$) based on a measurement of the amplified power ($P_{out}$), wherein a second regulator regulates the first regulator, in constant gain amplification mode (FGM) so that the first regulator supplies a setpoint at a value close to the constant value setpoint ($V_{fgm}$) by carrying out a closed-loop control of the setpoint of variable value ($V_{alc}$) transmitted by the first regulator based on the setpoint of constant value $V_{fgm}$.

2. The method as claimed in claim 1, comprising the additional step of transmitting to the first regulator a signal originating from a second regulator or a measurement of the output power ($P_{out}$) as a function of the amplification (FGM, ALC) produced.

3. The method as claimed in claim 1, comprising the additional step of transmitting to the controller a setpoint originating from a source of constant setpoint ($V_{fgm}$) or from the first regulator as a function of the amplification (FGM, ALC) produced.

4. The method as claimed in claim 1, comprising the additional step of increasing the response time of the first regulator.

5. A device for amplifying radiocommunication signals transmitted by a string of amplifiers furnished with a gain controller receiving a setpoint from a circuit comprising a first regulator forming, in a first amplification position (ALC) at a constant amplified power ($P_{out}$), a feedback loop on the string based on a detector of the amplified power ($P_{out}$), a second regulator forming with the first regulator, in a second amplification position (FGM) of the constant gain circuit, a feedback loop holding a setpoint transmitted by the first regulator at a value close to the setpoint ($V_{fgm}$) of constant value ($V_{fgm}$).

6. The device as claimed in claim 5, wherein a switch connects the first regulator to the second regulator or to the detector of amplified power ($P_{out}$) as a function of the amplification (FGM, ALC) produced.

7. The device as claimed in claim 5, wherein a second switch connects the controller to the first regulator or to a source of constant setpoint ($V_{fgm}$) as a function of the amplification (FGM, ALC) produced.

8. The device as claimed in claim 5, wherein at least one regulator comprises an operational amplifier.

9. The device as claimed in claim 8, the first and the second regulator comprising an operational amplifier, wherein each operational amplifier is associated with at least one resistor and with one capacitor such that the response time of the first regulator is greater than the response time of the second regulator.

10. The device as claimed in claim 5, wherein the first regulator is associated with means making it possible to increase its response time.

11. A method for controlling the gain of an amplification device furnished with a controller, the controller receiving a setpoint ($V_{att}$) of constant value ($V_{fgm}$), in order to obtain a constant gain, or of variable value ($V_{alc}$), in order to deliver a constant output application with the aid of a first regulator delivering the setpoint of variable value ($V_{alc}$) based on a measurement of the delivered function ($P_{out}$), a second regulator regulates the first regulator, in constant gain amplification mode (FGM) so that the first regulator supplies a setpoint, at a value close to the setpoint of constant value ($V_{fgm}$), by carrying out a closed-loop control of the setpoint of variable value $V_{alc}$ transmitted by the first regulator based on the setpoint of constant value ($V_{fgm}$).

12. A circuit for controlling the gain of an amplification device having a controller receiving a setpoint ($V_{att}$) of constant value ($V_{fgm}$), from the control circuit in order to obtain a constant gain, or of variable value ($V_{alc}$), the control circuit comprising a first regulator delivering the setpoint of variable value ($V_{alc}$) based on a measurement of the delivered function ($P_{out}$), a second regulator forming, in constant gain amplification mode (FGM), a feedback loop with the first regulator in order to hold a setpoint transmitted by this first regulator at a value close to the setpoint of constant value ($V_{fgm}$).

13. A satellite comprising a device for amplifying radiocommunication signals transmitted by a string of amplifiers furnished with a gain controller receiving a setpoint from a circuit comprising a first regulator forming, in a first amplification position (ALC) of the circuit, a feedback loop on the string based on a detector of the amplified power ($P_{out}$) in order to supply a variable setpoint ($V_{alc}$) to the controller, a second regulator forming, in constant gain amplification mode (FGM), a feedback loop with the first regulator in order to hold a setpoint transmitted by this first regulator at a value close to the setpoint of constant value ($V_{fgm}$).

\* \* \* \* \*